United States Patent [19]
Otto

[11] Patent Number: 4,990,979
[45] Date of Patent: Feb. 5, 1991

[54] NON-VOLATILE MEMORY CELL

[75] Inventor: Joachim Otto, Unterschleissheim, Fed. Rep. of Germany

[73] Assignee: Eurosil Electronic GmbH, Eching, Fed. Rep. of Germany

[21] Appl. No.: 350,722

[22] Filed: Apr. 27, 1989

[30] Foreign Application Priority Data

May 13, 1988 [DE] Fed. Rep. of Germany ....... 3816358

[51] Int. Cl.$^5$ ............... H01L 29/68; H01L 29/06; G11C 11/34
[52] U.S. Cl. .................. 357/23.5; 357/55; 365/185
[58] Field of Search ............... 357/23.6, 55; 365/185

[56] References Cited

U.S. PATENT DOCUMENTS

| | | | |
|---|---|---|---|
| 4,435,790 | 3/1984 | Tickle et al. | 365/218 |
| 4,471,471 | 9/1984 | DiMaria | 357/23.5 |
| 4,622,737 | 11/1986 | Ravaglia | 357/23.5 |
| 4,686,558 | 8/1987 | Adam | 357/23.5 |
| 4,796,228 | 1/1989 | Baglee | 365/185 |

FOREIGN PATENT DOCUMENTS 0177986 4/1986 European Pat. Off. .

OTHER PUBLICATIONS

IBM Technical Disclosure Bulletin, vol. 24, No. 3, Aug. 1981, pp. 1331–1333.
IEEE Electron Device Letters, vol. EDL-8, No. 4, Apr. 1987, pp. 146–147.

Primary Examiner—Rolf Hille
Assistant Examiner—Robert P. Limanek
Attorney, Agent, or Firm—Spencer & Frank

[57] ABSTRACT

The invention relates to an electrically erasable floating-gate memory cell (EEPROM) in which the Fowler-Nordheim tunnel effect is exploited for programming and erasing. In accordance with the invention, a trench adjacent to the side of the drain zone facing away from the channel zone and covered with a dielectric tunnel layer is provided in the semiconductor element, so that the floating-gate electrode extends into the trench in such a way that the tunnel current can flow horizontally to the semiconductor surface between the drain zone and the floating-gate electrode. This permits a reduction in the cell size and to higher integration densities. Preferably the floating gate electrodes of at least two cells extend into a single trench.

10 Claims, 6 Drawing Sheets

NON-VOLATILE MEMORY CELL

BACKGROUND OF THE INVENTION

The invention relates to an FET forming a non-volatile memory cell and having a source and a drain zone and a floating-gate electrode as the memory electrode between which and the semiconductor element is arranged to a tunnel-through dielectric layer, and to the use of such a memory cell. The invention further relates to a method for manufacture of such a memory cell.

A non-volatile memory cell of this type is known from "Nichtflüchtige Speicher: EEPROM's und KNRAM's", electronic FIG. 1, where a FLOTOX (Floating-Gate-Tunnel-Oxide) memory transistor developed by Intel for EEPROMs eelectrically erasable programmable read only memory is illustrated and described.

A FLOTOX cell of this type is electrically erasable and represents a further development of the UV-erasable cells. Whereas in the latter avalanche injection dominates during programming and erasing, i.e. discharging of the gate is achieved by exciting the electrons with UV radiation, in EEPROM cells the tunnel mechanism of the electrons according to Fowler-Nordheim is exploited in the vertical direction for programming and erasing.

With the FLOTOX memory transistor from Intel in accordance with the above reference, the tunnel oxide is above the drain zone. Depending on the potentials applied to the electrodes, an electrical field is generated in the tunnel oxide that either triggers the passage of electrons from the drain zone onto the floating gate—representing the "logic 1"state—or discharges the floating gate as the electrons tunnel back to the drain zone, thereby programming "logic 0". Each memory cell has for selectrion of the memory cells an NMOS transistor connected in series to the FLOTOX transistor.

In the following, the manufacture of a known FLOTOX memory cell of this type is described with the aid of FIGS. 1 to 3.

In accordance with FIG. 1, a gate oxide 3 and a first photoresist coating is deposited on an n-doped semiconductor substrate 1 after production of the active areas and of a P-through 4. An n+-doped area 6 is created in the semiconductor substrate 1 through an opening in the photoresist in order to produce the drain zone by means of ion implantation.

A second photoresist step with subsequent etching of the gate oxide 3 defines the tunnel window above the n+-doped area 6 in accordance with FIG. 2. This is followed by the production of tunnel oxide layer 11 with a thickness of approximately 100 Å and the deposition of the first polysilicon level, which is treated in a further photolithography and etching step to make the floating-gate electrode 12. The further process sequence starts as shown in FIG. 3 with the production of the Interpoly insulation layer 13 and is continued with the provision of the n+-doped source zone 15 by means of ion implantation.

A second polysilicon level is then applied to produce gate electrode 14, and the surface is then covered completely with an insulation layer 16. Finally, the contacthole areas 12, are generated in a final photolithography and etching step and the aluminum conductive paths 18 are vapour-deposited. Finally, the entire surface is covered with a passivation layer 19.

Drawbacks of this conventional technology are in the definition of the tunnel window by photolithography steps. The design of the memory cells must be such that the tunnel window is above the $n^{30}$ area 6 and its edge do not reach the edges of the active area. This puts heavy demands on the adjustment accuracy and restricts at the same time the minimization of the design by masking. In addition, the size of the tunnel window can be reduced at acceptable expense only to $2\ \mu m \times 2 \mu m$.

SUMMARY OF THE INVENTION

The object of the invention is to provide a memory cell of the type mentioned at the outset that has a tunnel window whose size is less than $2\ \mu m \times 2\ \mu m$. A further object of the present invention is to indicate a method for the production of such memory cells.

This object is attained by providing a trench in the semiconductor element with the trench being adjacent to the side of the drain zone facing away from the channel zone and covered with a dielectric layer, and by extending the floating-gate electrode into the trench in such a way that the tunnel current can flow horizontally to the semiconductor surface between the drain zone and the floating-gate electrode.

One advantage of this structure in accordance with the invention is the reduction in the size of the tunnel window, which improves the coupling factor since the area of the tunnel window and of the channel zone have a major influence on this factor. The size of the tunnel window is only determined by the final depth of the trench and the size of the floating-gate electrode on the side wall of the trench. In addition, an appropriate design permits the arrangement inside a trench of two or more of these memory cells in accordance with the invention that surround the trench radially in accordance with a preferred embodiment. According to a first advantageous embodiment of the invention, the trench is in rectangular form and the floating-gate electrode of the memory cell covers a side wall of the trench. A trench having a depth of approximately 1.5 $\mu m$ has proved particularly advantageous.

In a further preferred embodiment of the invention, the floating-gate electrodes of two memory cells are arranged in a single rectangular trench and are so formed that they cover two opposite side walls of the trench.

The invention likewise relates to a method for production of the memory cell with various advantageous features and embodiments of the method in accordance with the invention being described. In the method according to the invention the production of the tunnel window is self-adjusting, with the adjusting accuracy being less critical than in the production of a conventional memory cell.

A memory cell of this type produced in accordance with the invention has the advantage of the low cell size, giving a higher integration density, for example in memory modules.

BRIEF DESCRIPTION OF THE DRAWINGS

The invention will now be described in greater detail, with reference to the drawings, in which.

In the figures, identical elements have been given the same numbers.

DESCRIPTION OF THE PREFERRED EMBODIMENTS

The sizes and thicknesses given in the following description of the method steps to obtain a finished memory cell are based on a 3 μm technology.

Figure 1:
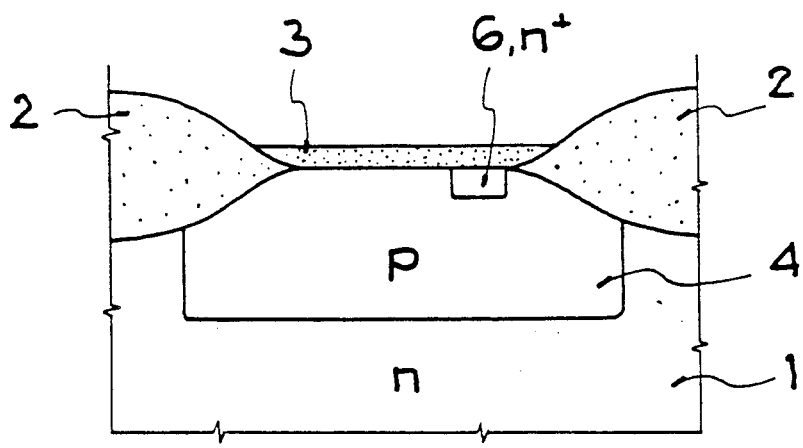
FIGS. 1 to 3 are sectional views showing sequential method steps to form a non-volatile floating-gate-tunnel-oxide memory cell according to the prior art.
Figure 2:
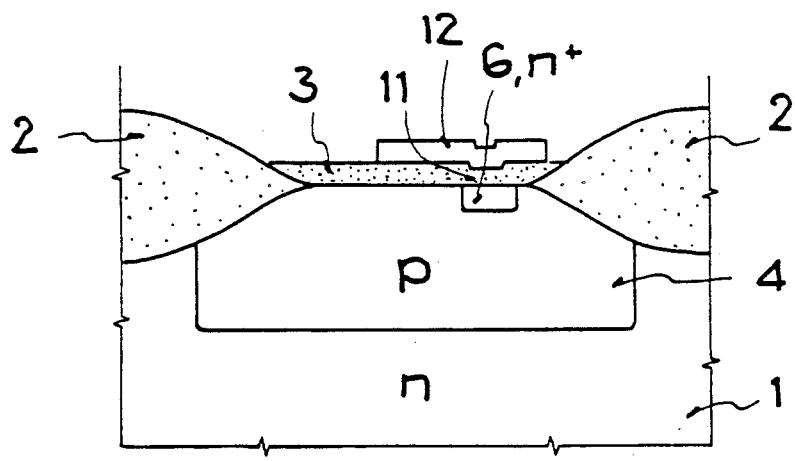
Figure 3:
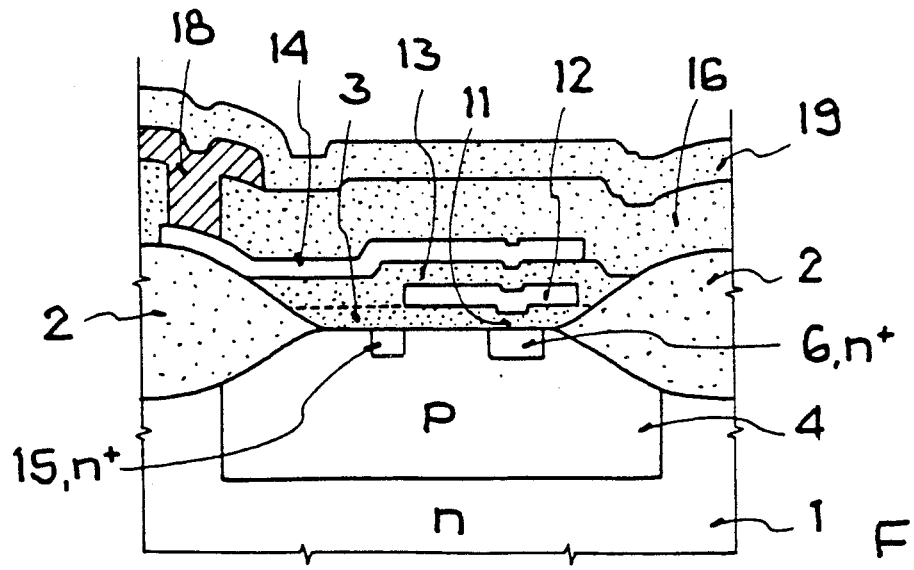
Figure 4:
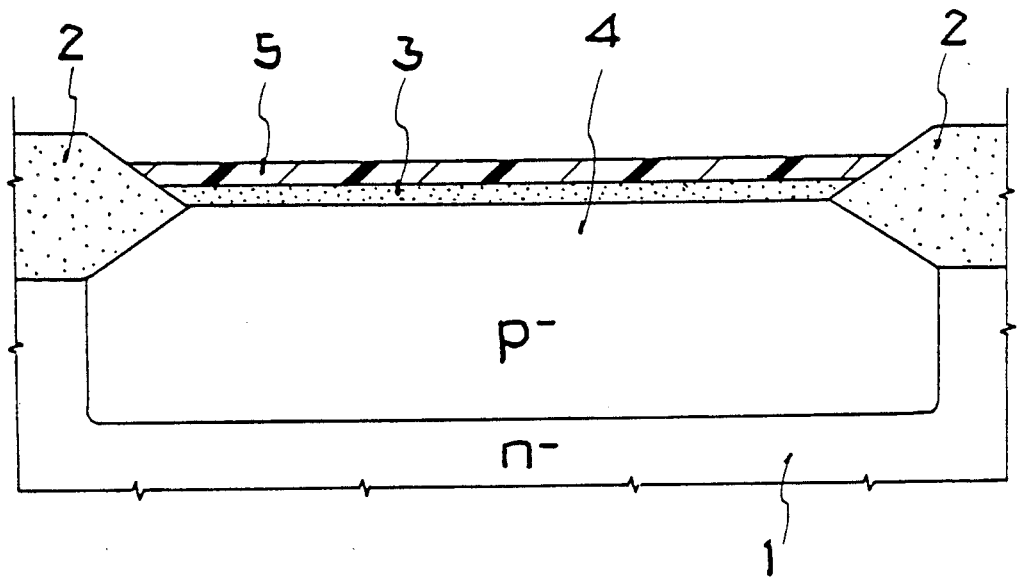
FIGS. 4 to 10 show in section subsequent method steps to obtain a finished memory cell according to the invention.
Figure 5:
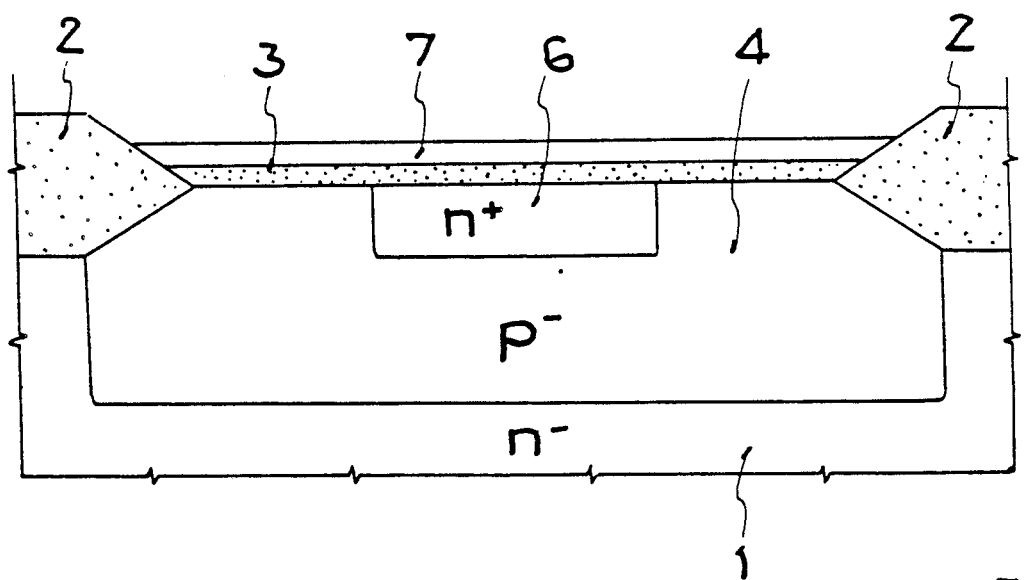

FIG. 4 shows a mono or signal-crystalline, $n^{31}$-doped silicon semiconductor substrate 1 following production of the active surface by means of local oxidation, the $p^-$-trough (4), and the gate oxide layer (3) with a thickness of approximately 40 nm. The definition of the active surface is effected by generation of field oxide areas 2 from silicon dioxide by means of a nitride process, while production of the $p^-$-trough (4) is achieved with ion implantation after masking with a first photoresist layer, not shown in the Figure. In addition, FIG. 4 shows a second photoresist layer 5 which is deposited onto gate oxide layer 3 after removal of the first photoresist layer. After structuring of this second photoresist layer 5 and opening of the photoresist, and $n^{30}$ area (depletion area) 6 (see FIG. 5) having a width of approximately 5 μm, a length of about 20 μm and a depth of approximately 1 μm is generated with a further ion implantation. This second photoresist layer 5 is then removed and a silicon nitride layer 7 is deposited in the area of $^-$-trough 4, as shown in the arrangement according to FIG. 5.

Figure 6:
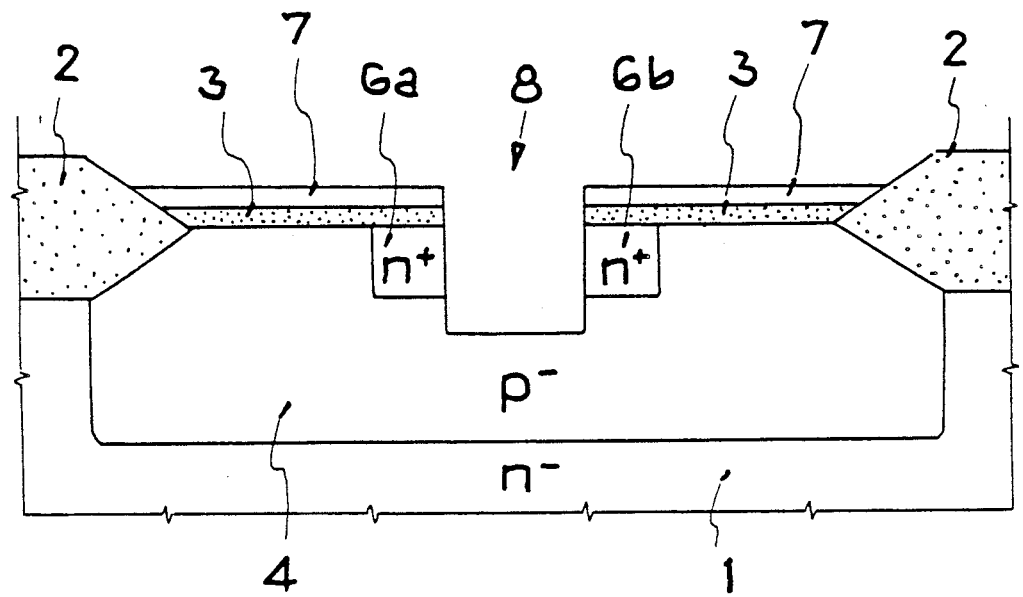

Depletion area 6 is then structured using a photoresist method (not shown in FIG. 5) to produce a trench 8 in accordance with FIG. 6, so that this area 6 is divided into two equal areas 6a and 6b.

FIG. 6 shows the arrangement after etching of trench 8, in which it is clear that trench 8 extends deeper than depletion area 6. Trench 8 has a width of approximately 5 μm and a depth of approximately 1.5 μm, with the depletion area 6 being approximately 1 μm deep. In addition, trench 8 divides the previously produced depletion area 6 symmetrically into two areas 6a and 6b, insulated from one another and representing the drain zones respective of the later memory cells.

Figure 7:
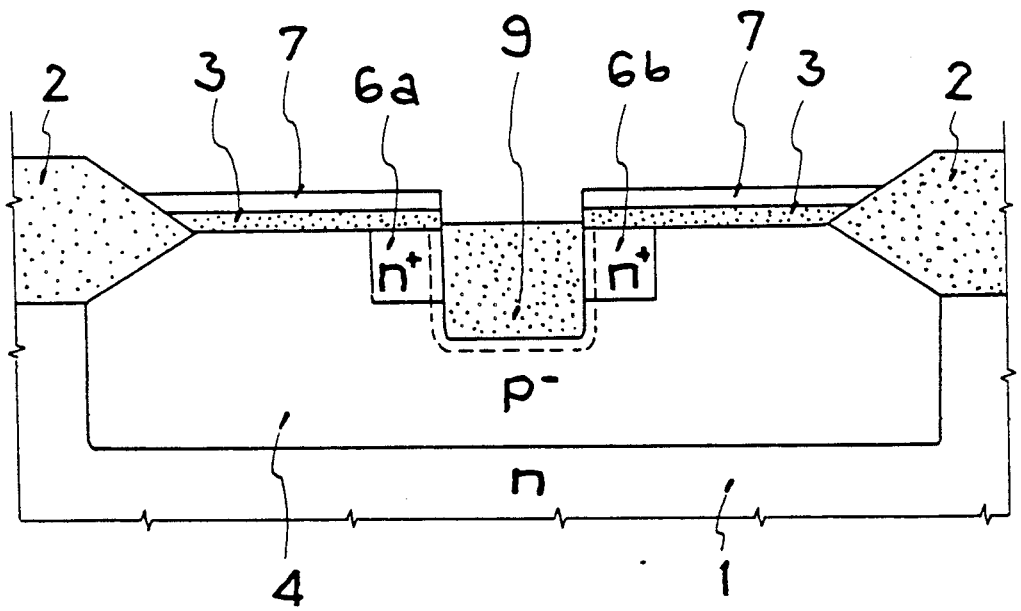

Trench 8 is now completely filled with oxide 9 by means of thermal oxidation using the silicon nitride layer 7 for masking, so that this trench 8 is enlarged both horizontally and vertically, as indicated in FIG. 7 by the dotted line surrounding trench 8.

Figure 8:
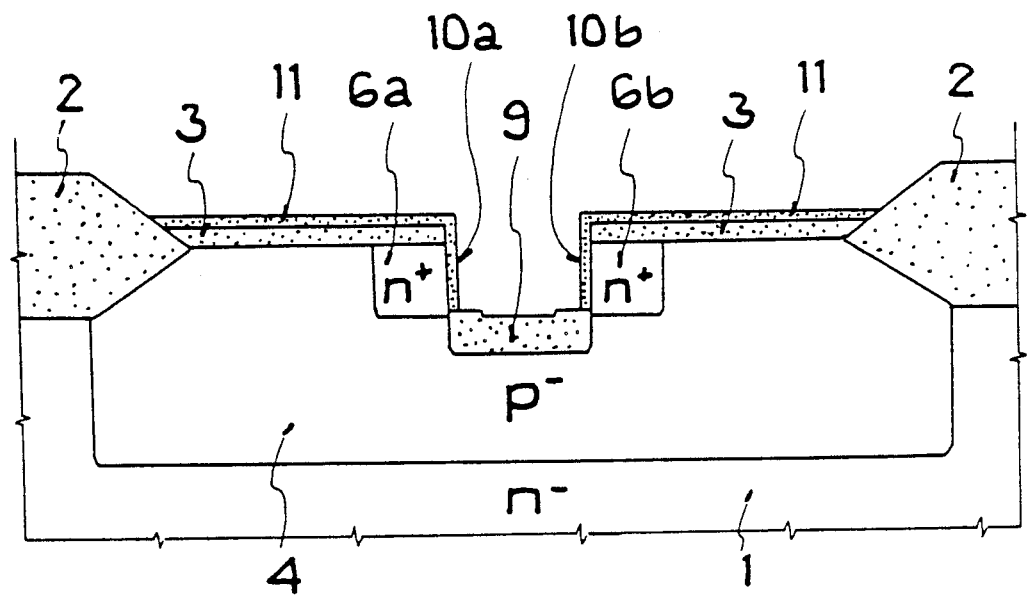

A wet-etching step follows with which parts of the side walls 10a and 10b—the later tunnel windows 10 a and 10b—of trench 8 that are adjacent to drain zones 6a and 6b are exposed, as shown in FIG. 8. Also in accordance with FIG. 8, tunnel oxidation to generate the tunnel oxide 11 with a thickness of approximately 10 nm is implemented following removal of the silicon nitride layer 7.

In the further process sequence, the first polysilicon layer having a thickness of approximately 0.5 μm is deposited and forms the floating gate 12a and 12b, with this layer being so structured that two cells are produced simultaneously in trench 8. The entire surface in the area of the $p^-$-trough 4 is now provided in an oxidation process with a polyoxide layer ($SiO_2$), the intermediate insulation layer 13, having a thickness approximately 60 nm.

Figure 9:
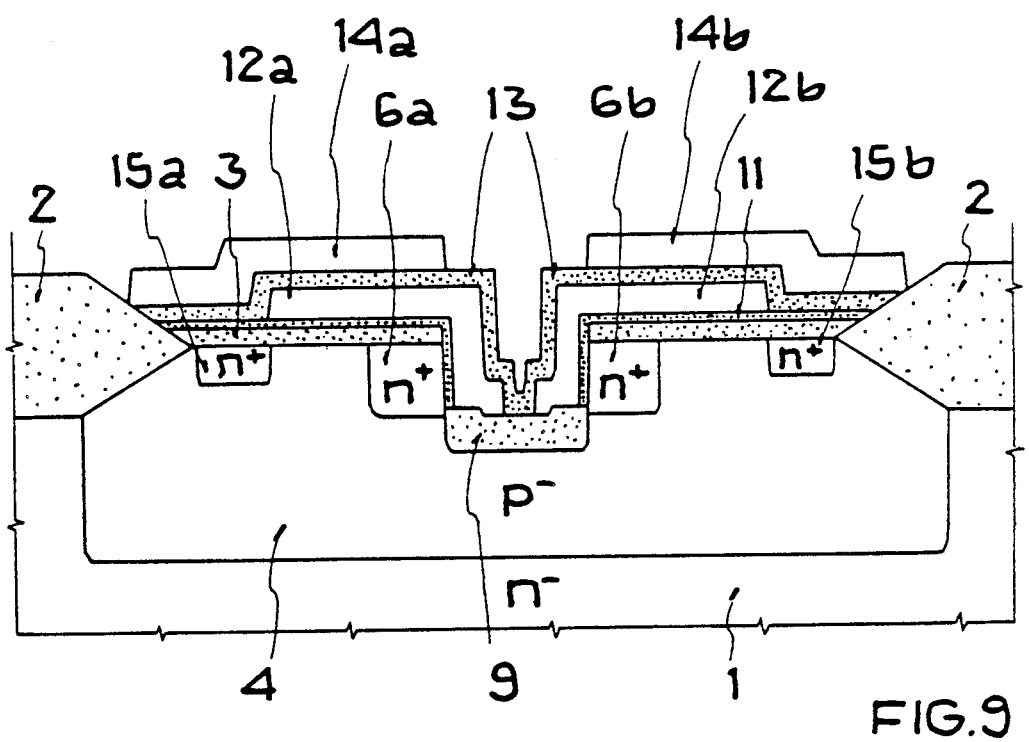

To form the source zones 15a and 15b, a further ion implantation is carried out, followed by the deposition of the second polysilicon layer. FIG. 9 shows this arrangement after structuring of the second polysilicon layer to form the control gates 14a and 14b, which also have a thickness of approximately 0.5 μm.

Figure 10:
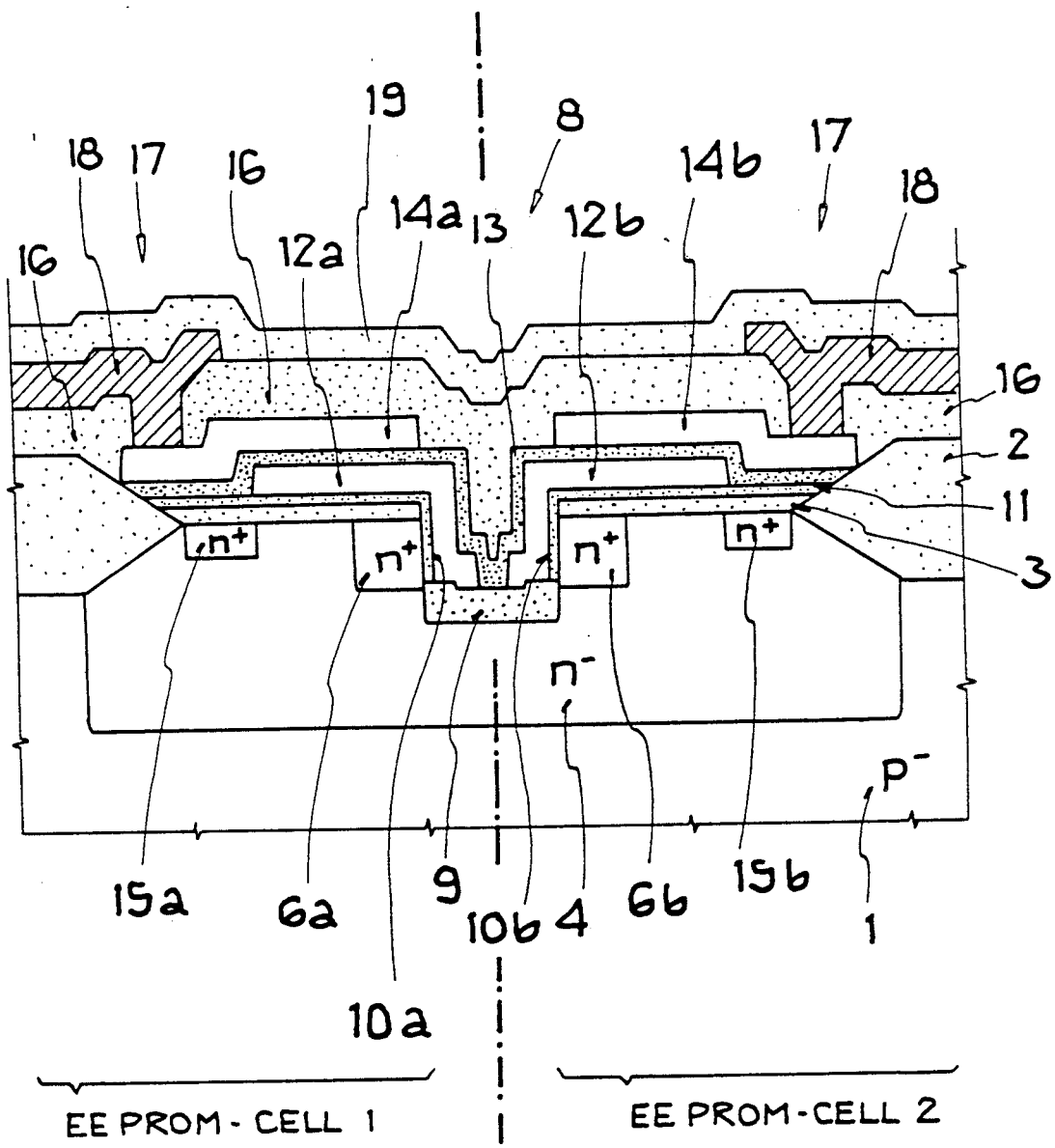

FIG. 10 now shows the finished array comprising two EEPROM memory cells after generation of the insulation layer 16 as a polyoxide layer ($SiO_2$), having a thickness of approximately 0.7 μm, of the contact hole areas 17, of the metal conductive path level 18, and of the final surface passivation 19. These latter processes are implemented in the known manner.

Figure 11:
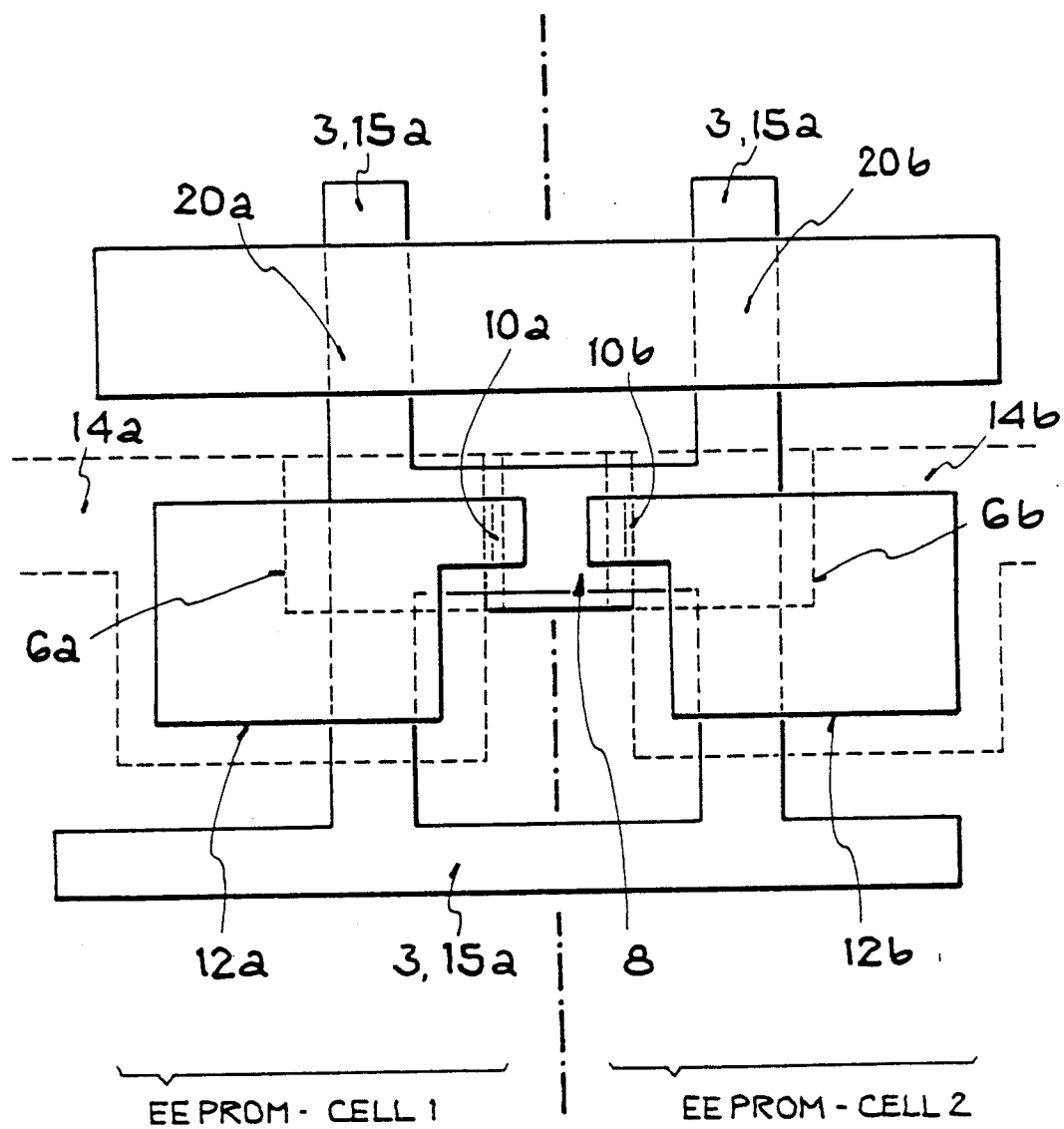
FIG. 11 shows the layout of two EEPROM memory cells according to FIG. 10.

FIG. 11 shown the layout of the two EEPROM memory cells according to FIG. 10 with a common trench 8 having an area of approximately 5 μm × 5 μm. Each memory cell here has a standard NMOS transistor (select transistor) 20a or 20b connected in series to the FLOTOX transistor and used to select the memory cells. The space-saving arrangement of the lateral tunnel windows 10a and 10b can be seen clearly in this figure. The two FLOTOX transistors each take up an area of approximately 110 $μm^2$, while the two memory cells with the select transistors each require an area of approximately 500 $μm^2$, representing a reduction in size of approximately 50% compared with the prior art.

Not only two memory cells can be arranged in a trench, but also, with suitable structuring of the first polysilicon level, three and more cells can be produced simultaneously with a common trench.

What is claimed is:

1. In a non-volatile memory cell array including a plurality of non-volatile memory cells which are formed at a surface of a semiconductor substrate and which each includes spaced source and drain zones formed in said surface, a trench provided in said surface adjacent the side of said drain zone facing away from the channel zone, a tunnel through dielectric layer disposed on said surface and covering at least the side walls of said trench, and a floating-gate electrode, as the memory electrode, disposed on said dielectric layer and extending into said trench; the improvement wherein:
   said drain zone of at lest two of said non-volatile memory cells are disposed adjacent a single said trench and said floating-gate electrodes of said at lest two memory cells extend into said signal trench so that tunnel current can flow horizontally to the semiconductor surface between a respective said drain zone and the associated one of said floating-gate-electrodes.

2. A non-volatile memory cell array according to claim 1, wherein said trench is rectangular and wherein a respective portion of a side wall of said single trench is covered by each of said floating-gate electrodes of said at least two memory cells.

3. A non-volatile memory cell array according to claim 2, wherein said trench has a depth of approximately 1.5 μm.

4. A non-volatile memory cell array according to claim 1, wherein said floating-gate electrodes of said at least two memory cells are arranged radially around said trench.

5. A non-volatile memory cell array according to claim 2, wherein the two said floating-gate electrodes cover portions of two opposite side walls of said rectangular trench.

6. An array according to claim 1, wherein said trench is deeper than said drain zones.

7. An array according to claim 1, wherein said trench is symmetrically disposed between two identical said drain zones.

8. An array according to claim 1, wherein said semiconductor substrate comprises silicon.

9. An array according to claim 1, wherein said gate electrodes comprise polysilicon.

10. In a non-volatile memory cell array including at least first and second non-volatile memory cells formed on a semiconductor substrate and each including a floating-gate field effect transistor having spaced source and drain zones formed in a surface of said semiconductor substrate and defining a channel zone therebetween, and a floating-gate electrode, which serves as the memory electrode, arranged on a tunnel-through dielectric layer disposed on said surface of said semiconductor substrate; the improvement wherein:

a single trench is formed in said surface of said semiconductor element adjacent the side of the drain zone which faces away from the respective said channel zone of at least each of said first and second memory cells;

said dielectric layer covers at least the side walls of said trench; and said floating gate electrode of each of said first and second memory cells extends along said dielectric layer into said trench and over respective portions of said side walls such that tunnel current can flow horizontally to the semiconductor surface between said drain zones and respectively associated said floating-gate electrodes.

* * * * *